(12) United States Patent
Zhuang

(10) Patent No.: US 8,395,253 B2
(45) Date of Patent: Mar. 12, 2013

(54) HERMETIC SURFACE MOUNTED POWER PACKAGE

(75) Inventor: Weidong Zhuang, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/042,986

(22) Filed: Jan. 25, 2005

(65) Prior Publication Data

US 2005/0161786 A1 Jul. 28, 2005

Related U.S. Application Data

(60) Provisional application No. 60/540,221, filed on Jan. 28, 2004.

(51) Int. Cl.
*H01L 23/12* (2006.01)
*H01L 23/04* (2006.01)

(52) U.S. Cl. .. 257/704; 257/784; 257/698; 257/E23.181

(58) Field of Classification Search .................. 257/686, 257/707, 675, 677, 728, 704, 706, 784, 698, 257/E23.181
See application file for complete search history.

(56) References Cited

U.S. PATENT DOCUMENTS

| | | | | |
|---|---|---|---|---|
| 3,784,883 A | * | 1/1974 | Duncan et al. | 257/664 |
| 4,677,526 A | * | 6/1987 | Muehling | 361/718 |
| 4,990,720 A | * | 2/1991 | Kaufman | 174/52.4 |
| 5,015,803 A | * | 5/1991 | Mahulikar et al. | 174/529 |
| 5,343,073 A | * | 8/1994 | Parthasarathi et al. | 257/666 |
| 5,463,248 A | * | 10/1995 | Yano et al. | 257/677 |
| 5,572,065 A | * | 11/1996 | Burns | 257/666 |
| 5,773,879 A | * | 6/1998 | Fusayasu et al. | 257/678 |
| 5,814,883 A | * | 9/1998 | Sawai et al. | 257/712 |
| 5,814,884 A | * | 9/1998 | Davis et al. | 257/723 |
| 5,874,321 A | * | 2/1999 | Templeton et al. | 438/107 |
| 6,225,700 B1 | * | 5/2001 | Ito et al. | 257/780 |
| 6,285,067 B1 | * | 9/2001 | Hyoudo et al. | 257/529 |
| 6,476,481 B2 | * | 11/2002 | Woodworth et al. | 257/696 |
| 6,528,875 B1 | * | 3/2003 | Glenn et al. | 257/704 |
| 6,827,978 B2 | * | 12/2004 | Yoon et al. | 427/250 |
| 6,833,617 B2 | * | 12/2004 | Kondo et al. | 257/707 |
| 6,906,414 B2 | * | 6/2005 | Zhao et al. | 257/707 |
| 6,921,971 B2 | * | 7/2005 | Basho et al. | 257/706 |
| 2002/0135061 A1 | * | 9/2002 | Okamoto et al. | 257/703 |
| 2004/0104489 A1 | * | 6/2004 | Larking | 257/787 |
| 2005/0023030 A1 | * | 2/2005 | Lee et al. | 174/252 |
| 2005/0133906 A1 | * | 6/2005 | Woodall et al. | 257/707 |
| 2006/0006405 A1 | * | 1/2006 | Mazzochette | 257/99 |

OTHER PUBLICATIONS

Contain. Definiton retreived on Jan. 9, 2008 from dictionary.com. Three pages total.*
Hermetic. Definiton retreived on Jan. 9, 2008 from dictionary.com. Two pages total.*
Semiconductor Far East Webpage entry on Die Bond—two documents totaling 5 pages.*

* cited by examiner

*Primary Examiner* — Nitin Parekh

(74) *Attorney, Agent, or Firm* — Farjami & Farjami LLP

(57) ABSTRACT

A semiconductor package which includes a substrate formed from AlN and electrical terminals formed from tungsten on at least one surface of the substrate by bulk metallization to serve as electrical connection to a component within the package.

14 Claims, 2 Drawing Sheets

HERMETIC SURFACE MOUNTED POWER PACKAGE

RELATED APPLICATION

This application is based on and claims benefit of U.S. Provisional Application Ser. No. 60/540,221, filed Jan. 28, 2004, entitled Hermetic Surface Mount Power Package with Ultra-Low Lead Resistance, to which a claim of priority is hereby made and the disclosure of which is incorporated herein by reference.

FIELD OF INVENTION

The present invention relates to semiconductor packages and more particularly to high reliability semiconductor packages.

BACKGROUND OF THE INVENTION

A high reliability semiconductor package typically includes a semiconductor device which is hermetically sealed in a housing portion thereof. Typical semiconductor devices used in high reliability semiconductor packages are power MOSFETs, bipolar transistors, Schottky diodes, PN junction diodes, and IGBTs.

Hermetic surface mount packages, leadless chip carriers and ceramic leadless chip carriers (also known as LCC and CLCC respectively) have served as high reliability platforms for more than 20 years.

In the recent years, a vast array of electronic designs have been integrating new surface mount packages (also referred to as surface mounted devices or SMDs) which have surface mountable terminals on a common surface thereof. Such SMDs are desirable due to their smaller size and footprint, lighter weight, and excellent thermal performance. In addition, many high frequency circuit designs benefit from the inherently low inductance and low resistance of such SMDs.

The following are some more advantages of such SMDs:
1) very low profile when compared to TO- and MO-types of packages;
2) light weight;
2) ideal for single MOSFET, IGBT and BJT die;
3) capable of dissipating very high power due to low thermal resistance from junction to case and employing low electrical resistance material for terminal design;
4) extremely reliable at package level and when used on CCA and CIC type of boards;
5) when used as building blocks for high reliability power modules, they can be pre-screened to give high yield at module level.

The following are some of the disadvantages of such SNDs:
1) thermal and reliability performance are largely nullified when they are used on organic printed circuit boards;
2) all connections are on the same plane which makes soldering, cleaning and inspection difficult;
3) problems with testing when multiple chips are packaged (e.g. synchronous rectifiers);
4) additional ceramic carriers are used to provide electrical isolation, stress relief to the leads, which may add many problems such as difficulty in inspection, significant increase of thermal resistance, and more cost;
5) cost is about four times higher than an ordinary TO-packages with comparable cavity size.

It is desirable to have a package which exhibits the advantages, but not the disadvantages of the prior art SMDs.

SUMMARY OF THE INVENTION

A package according to the first embodiment of the present invention includes a substrate having an opening therein having a mouth at the first surface of the substrate and another mouth at a second opposing surface of the substrate, a power semiconductor device disposed within the opening, at least one but preferably three terminals on one surface of the substrate, another terminal on the second opposing surface of the substrate hermetically closing the mouth of the opening at the second surface of the substrate and a cover hermetically closing the mouth of the opening at the first surface of the substrate.

A package according to the second embodiment of the present invention includes a substrate having a recess therein having a mouth at the first surface of the substrate, an electrically conductive plate at the bottom of the recess, a power semiconductor device disposed within the recess, at least one but preferably three terminals on one surface of the substrate, and a cover hermetically closing the mouth of the opening at the first surface of the substrate.

According to one aspect of the present invention the substrate is formed from AlN. The use of AlN is desirable because it provides the required electrical insulation, but has a higher thermal conductivity than $Al_2O_3$, thus allowing for higher power dissipation.

According to another aspect of the present invention, the terminals of the package are formed from tungsten preferably by bulk metallization of tungsten on the substrate. As a result, each terminal exhibits an On resistance of about 2 mOhms, which is less than the On resistance of a typical semiconductor device in the package.

Other features and advantages of the present invention will become apparent from the following description of the invention which refers to the accompanying drawings.

DETAILED DESCRIPTION OF THE FIGURES

Figure 1:
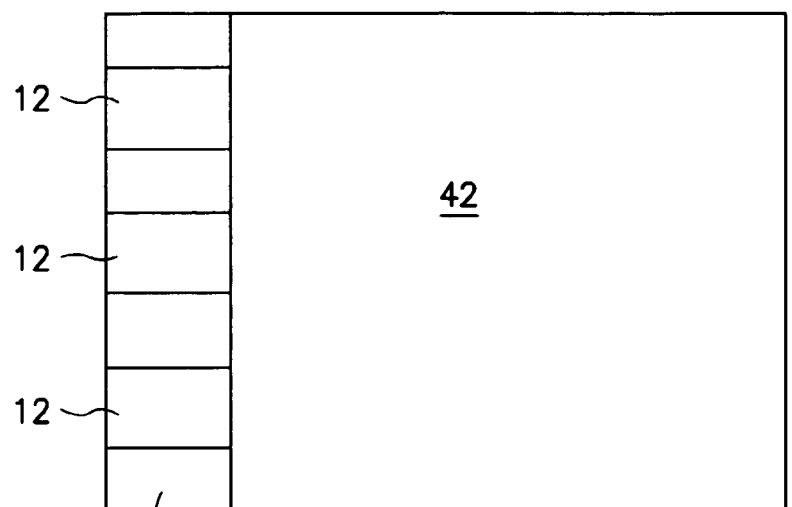
FIG. 1 shows a top plan view of a package according to the present invention.

Referring first to FIG. 1, a semiconductor package according to the present invention includes substrate 10, and first electrical terminals 12 disposed on and attached to the first major surface of substrate 10.

According to an aspect of the present invention, substrate 10 is formed from a thermally conductive ceramic such as AlN. Terminals 12 are preferably made from tungsten and preferably formed by bulk metallization of tungsten on substrate 10.

Figure 2:
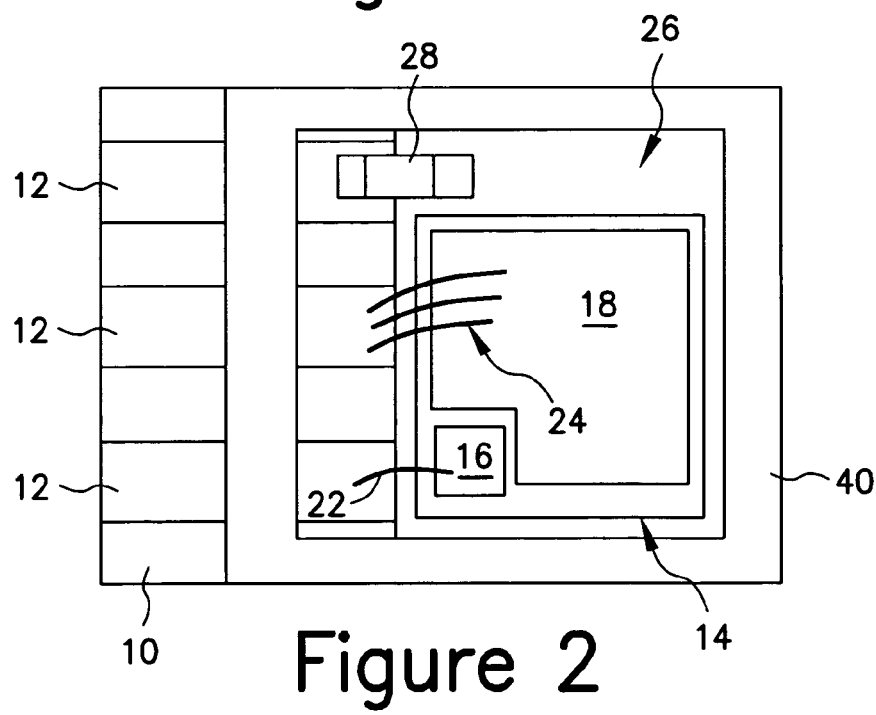
FIG. 2 shows a top plan view of a package according to the present invention having its lid removed to illustrate its internal components.

Referring next to FIG. 2, a package according to the present invention includes a semiconductor die 14. Semiconductor die 14 is preferably a power MOSFET, which includes gate electrode 16, source electrode 18, and drain electrode 20 (see FIG. 4). A package according to the present invention may include an IGBT, or a power diode instead of a power MOSFET without deviating from the scope and spirit of the present invention.

Gate electrode 16 may be electrically connected to a respective terminal 12 by a wire bond 22, and source electrode 18 may be electrically connected to another terminal 12 by one or a plurality of source wire bonds 24.

In the preferred embodiment of the present invention, drain electrode 20 of the power MOSFET is disposed opposite to its source electrode 18, and is electrically and mechanically connected to a die receiving surface 26 of an electrical conductor. According to one arrangement, a jumper 28 is electrically connected at one end thereof to a respective terminal 12 by solder or the like, and at the other end thereof to die receiving surface 26, also by solder or the like, whereby drain electrode 20 of the power MOSFET may be electrically connected to at least one terminal 12.

Figure 3:
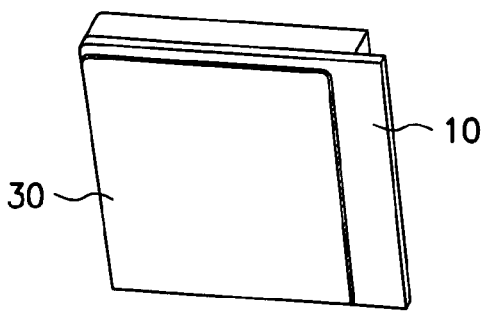
FIG. 3 shows a bottom perspective view of a package according to the first variation of the present invention.
Figure 4:
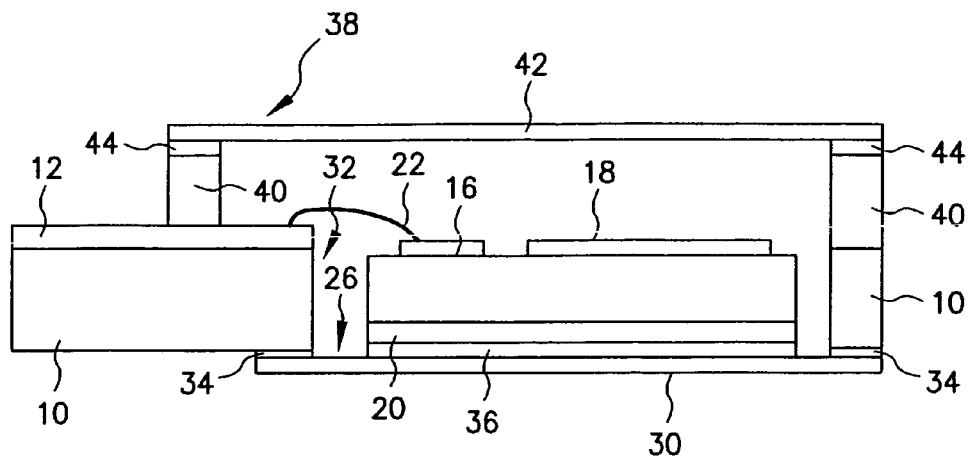
FIG. 4 shows a cross-sectional view of a package according to the first variation of the present invention as would be viewed along line 1-1 of FIG. 1 in the direction of the arrows.

Referring now to FIGS. 3 and 4, a package according to a first variation of the present invention includes a bottom terminal 30 disposed on the second, opposing surface of substrate 10.

Referring specifically to FIG. 4, substrate 10 includes opening 32, which has a mouth at the first surface of substrate 10 and a mouth at the second surface of substrate 10. Terminal 30 is selected to have an area that is larger than the mouth of opening 32 at the second surface of substrate 10, and is attached to substrate 10 such that the mouth of opening 32 at the second surface of substrate 10 is closed. In the preferred embodiment of the present invention, terminal 30 is attached to substrate 10 by brazing or the like such that a hermetic seal is obtained between terminal 30 and substrate 10. In the preferred embodiment of the present invention molybdenum or tungsten is used to form a hermetic seal 34 between terminal 30 and substrate 10.

As previously indicated, drain electrode 20 of the power MOSFET is electrically connected by a conductive adhesive, such as solder 36 or the like, to die receiving surface 26, which is the surface of terminal 30 that is accessible through opening 32 of substrate 10.

A package according to the present invention further includes cover 38. Cover 38 is disposed over, and closes the mouth of opening 32 at the first surface of the substrate. In the preferred embodiment, cover 38 includes enclosure 40, which is preferably formed from a low thermal expansion alloy such as Kovar and is hermetically attached to substrate 10. Furthermore, cover 38 includes lid 42, which is preferably attached to enclosure 40 by hermetic seal 44, whereby die 14 is hermetically sealed. Thus, a package according to the first variation of the present invention includes an electrical terminal 30 which is capable of serving both as an electrical terminal and a thermal path for transmitting the heat generated by die 14 to the exterior of the package where it can be dissipated. If terminal 30 is used as an electrical terminal for connecting to drain electrode 20 of the power MOSFET, jumper 28 may be excluded, leaving one terminal 12 open for another use. The open terminal could then be connected to source electrode 18 by a Kelvin wire or the like and thus serve as a source sense terminal for measuring the current that is traveling through source electrode 18 of the power MOSFET.

Figure 5:
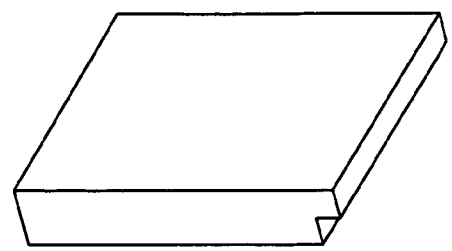
FIG. 5 shows a bottom plan view of a package according to the second variation of the present invention.
Figure 6:
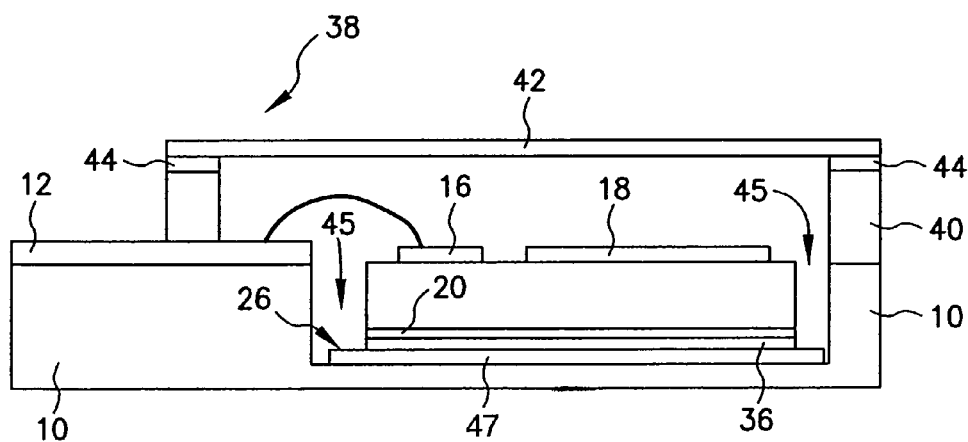
FIG. 6 shows a cross-sectional view of a package according to the second variation of the present invention as would be viewed along line 1-1 of FIG. 1 in the direction of the arrows.
Figure 7:
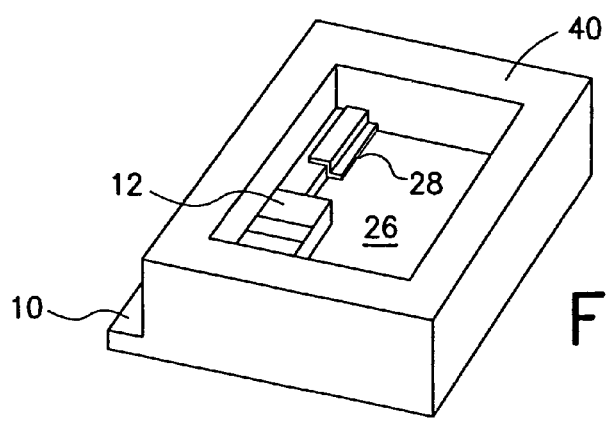
FIG. 7 is a perspective view of a package according to the present invention having its lid and its die removed.

Referring now to FIGS. 5 and 6, a package according to the second variation of the present invention does not include a bottom electrode. Referring specifically to FIG. 6, substrate 10 includes recess 45, an electrically conductive body 47 is brazed to the bottom of recess 45, and drain electrode 20 of the power MOSFET is electrically and mechanically attached to die receiving surface 26 of electrically conductive body 47 by a conductive adhesive such as solder 36 or the like. Conductive body 47 may be formed from a highly thermally conductive metal, such as a copper-tungsten alloy or copper-molybdenum alloy. A package according to the second invention thus includes an electrically insulated, but thermally conductive bottom surface.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
   a substrate having a recess, a first surface coinciding with a bottom of said recess, and a second surface spaced above said first surface;
   a plurality of laterally spaced electrical terminals bulk metallized onto said second surface of said substrate and contained within boundaries of said substrate;
   an electrical conductor disposed on said first surface of said substrate, said electrical conductor including a die receiving surface electrically connected to one of said plurality of laterally spaced electrical terminals;
   at least one semiconductor die, said semiconductor die including a first electrode on one surface thereof and a second electrode on an opposing surface thereof, said first electrode being electrically connected to another one of said plurality of laterally spaced electrical terminals and said second electrode being electrically and mechanically coupled to said die receiving surface by a conductive adhesive; and
   a cover including an enclosure and a lid attached to said enclosure disposed over and enclosing said semiconductor die hermetically;
   wherein said plurality of laterally spaced electrical terminals is disposed along one side of said at least one semiconductor die, and extends along said second surface and under said enclosure from an interior of said enclosure to an exterior thereof.

2. A package according to claim 1, wherein said conductive adhesive is solder.

3. A package according to claim 1, wherein said lid is comprised of Kovar or Alloy 42.

4. A package according to claim 1, wherein said cover hermetically seals said semiconductor die.

5. A package according to claim 1, wherein said substrate is comprised of AlN.

6. A package according to claim 1, wherein said semiconductor die is a power MOSFET, or an IGBT, or a power diode.

7. A package according to claim 1, wherein said plurality of laterally spaced electrical terminals are comprised of tungsten.

8. A semiconductor package comprising:
   a substrate having a hole, a first surface coinciding with a bottom of said hole, and a second surface spaced above said first surface;
   a plurality of laterally spaced electrical terminals bulk metallized onto said second surface of said substrate and contained within boundaries of said substrate;

an electrical conductor disposed on said first surface of said substrate, said electrical conductor including a die receiving surface, electrically connected to one of said plurality of laterally spaced electrical terminals;

at least one semiconductor die, said semiconductor die including a first electrode on one surface thereof and a second electrode on an opposing surface thereof, said first electrode being electrically connected to another one of said plurality of laterally spaced electrical terminals and said second electrode being electrically and mechanically coupled to said die receiving surface by a conductive adhesive; and a cover including an enclosure and a lid attached to said enclosure disposed over and enclosing said semiconductor die hermetically;

wherein said plurality of laterally spaced electrical terminals is disposed along one side of said at least one semiconductor die, and extends along said second surface and under said enclosure from an interior of said enclosure to an exterior thereof.

9. A package according to claim 8, wherein said conductive adhesive is solder.

10. A package according to claim 8, wherein said lid is comprised of Kovar or Alloy 42.

11. A package according to claim 8, wherein said substrate is comprised of AlN.

12. A package according to claim 8, wherein said semiconductor die is a power MOSFET, or an IGBT, or a power diode.

13. A package according to claim 8, wherein said plurality of laterally spaced electrical terminals are comprised of tungsten.

14. A package according to claim 8, wherein said plurality of laterally spaced electrical terminals are formed along one edge of said substrate.

* * * * *